(12) United States Patent
Gardner et al.

(10) Patent No.: US 11,978,735 B2
(45) Date of Patent: May 7, 2024

(54) TRANSISTOR STACK OF VERTICAL CHANNEL FERROELECTRIC FETs AND METHODS OF FORMING THE TRANSISTOR STACK

(71) Applicant: TOKYO ELECTRON LIMITED, Tokyo (JP)

(72) Inventors: Mark I. Gardner, Cedar Creek, TX (US); Robert D. Clark, Livermore, CA (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 12 days.

(21) Appl. No.: 17/720,944

(22) Filed: Apr. 14, 2022

(65) Prior Publication Data
US 2023/0335555 A1    Oct. 19, 2023

(51) Int. Cl.
| | | |
|---|---|---|
| *H10B 51/30* | (2023.01) | |
| *H01L 21/8238* | (2006.01) | |
| *H01L 27/092* | (2006.01) | |
| *H01L 29/51* | (2006.01) | |
| *H01L 29/66* | (2006.01) | |
| *H01L 29/78* | (2006.01) | |
| *H01L 29/786* | (2006.01) | |

(52) U.S. Cl.
CPC .. *H01L 27/0922* (2013.01); *H01L 21/823814* (2013.01); *H01L 21/823828* (2013.01); *H01L 21/823857* (2013.01); *H01L 21/823885* (2013.01); *H01L 29/516* (2013.01); *H01L 29/6684* (2013.01); *H01L 29/78391* (2014.09); *H01L 29/78618* (2013.01); *H01L 29/78642* (2013.01); *H01L 29/78648* (2013.01)

(58) Field of Classification Search
CPC ........ H01L 27/0922; H01L 21/823814; H01L 21/823828; H01L 21/823857; H01L 21/823885; H01L 29/516; H01L 29/6684; H01L 29/78391; H01L 29/78618; H01L 29/78642; H01L 29/78648; H01L 29/40111; H01L 27/11597; H01L 27/1159; H01L 29/66545; H01L 27/0886; H10B 51/20; H10B 51/30
See application file for complete search history.

(56) References Cited

U.S. PATENT DOCUMENTS

2023/0320100 A1* 10/2023 Yamazaki ............. H10B 53/20
257/295

FOREIGN PATENT DOCUMENTS

WO    WO-2021173176 A1 *  9/2021  ........... G11C 11/223
WO    WO-2022059956 A1 *  3/2022

* cited by examiner

*Primary Examiner* — Jae Lee

(57) ABSTRACT

A semiconductor device includes a substrate having a substrate surface, a transistor stack provided on the substrate surface and including a plurality of transistors stacked on each other along a vertical direction that is perpendicular to the substrate surface. Each transistor in the transistor stack includes a vertical channel structure extending along the vertical direction and having a first vertical sidewall and a second vertical sidewall opposite to the first vertical sidewall, and a ferroelectric gate structure in contact with the first vertical sidewall of the vertical channel structure; and a back gate structure provided on the substrate and in contact with the second vertical sidewall of the vertical channel structure of each respective transistor in the transistor stack.

11 Claims, 12 Drawing Sheets

TRANSISTOR STACK OF VERTICAL CHANNEL FERROELECTRIC FETs AND METHODS OF FORMING THE TRANSISTOR STACK

FIELD OF THE INVENTION

The present disclosure relates to semiconductor fabrication, and, more particularly, to methods of fabricating ferroelectric 3D semiconductor device designs.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the microscale or nanoscale, various fabrication processes are executed such as film-forming depositions, etch mask creation, patterning, material etching and removal, and doping treatments. These processes are performed repeatedly to form desired semiconductor device elements on a substrate. With microfabrication, transistors have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

3D integration, i.e., the vertical stacking of multiple devices, aims to overcome these scaling limitations by increasing transistor density in volume rather than area. Complementary metal oxide semiconductor (CMOS) very-large-scale integration (VLSI) scaling, as used for example in CPU or GPU products, is exploring adoption of 3D integration as a primary means of moving the semiconductor roadmap forward, and thus desires enabling technologies.

SUMMARY

Aspects of the present disclosure provide a semiconductor device having a transistor stack of vertical channel ferroelectric FETs.

An aspect (1) provides a semiconductor device including: a substrate having a substrate surface; a transistor stack provided on the substrate surface and including a plurality of transistors stacked on each other along a vertical direction that is perpendicular to the substrate surface, wherein each transistor in the transistor stack includes: a vertical channel structure extending along the vertical direction and having a first vertical sidewall and a second vertical sidewall opposite to the first vertical sidewall, and a ferroelectric gate structure in contact with the first vertical sidewall of the vertical channel structure; and a back gate structure provided on the substrate and in contact with the second vertical sidewall of the vertical channel structure of each respective transistor in the transistor stack.

An aspect (2) includes the semiconductor device of aspect (1), wherein the ferroelectric gate structure of each transistor includes: a gate dielectric in contact with the first vertical sidewall of the vertical channel structure of the transistor, the gate dielectric including a ferroelectric material; and a gate electrode provided in contact with the gate dielectric.

An aspect (3) includes the semiconductor device of aspect (2), wherein the ferroelectric gate structure of each transistor further includes a gate electrode interface liner interposed between the gate dielectric and the gate electrode.

An aspect (4) includes the semiconductor device of aspect (1), wherein the back gate structure includes: a back gate dielectric in contact with the second vertical sidewall of the vertical channel structure of each respective transistor in the transistor stack; and a back gate electrode in contact with the back gate dielectric.

An aspect (5) includes the semiconductor device of aspect (4), wherein the back gate dielectric includes a ferroelectric material.

An aspect (6) includes the semiconductor device of aspect (1), wherein each transistor further includes: a source region; and a drain region, one of the source and drain regions being arranged on an upper side of the ferroelectric gate structure and in contact with the first vertical sidewall, and another of the source and drain regions is arranged on a lower side of the ferroelectric gate structure and in contact with the first vertical sidewall of the vertical channel structure of the transistor in the transistor stack.

An aspect (7) includes the semiconductor device of aspect (6), wherein each of the source region and drain region includes a doped semiconductor material.

An aspect (8) includes the semiconductor device of aspect 71), wherein: for each transistor in the transistor stack: the vertical channel structure is a tube-shaped semiconductor structure extending in the vertical direction and having an outer wall as the first vertical sidewall of the vertical channel structure and an inner wall as the second vertical sidewall of the vertical channel structure, the ferroelectric gate structure includes an annular ring of ferroelectric material in contact with the outer wall of the tube-shaped semiconductor structure, and the source structure and the drain structure each include an annular ring of semiconductor material in contact with the outer wall of the tube-shaped semiconductor structure; and the back gate structure includes: a core back gate electrode extending along the vertical direction and passing through an inner region of each of the tube-shaped semiconductor structures, and a core back gate dielectric provided in the inner region to insulate the core back gate electrode from each of the tube-shaped semiconductor structures.

An aspect (9) includes the semiconductor device of aspect (8), wherein the plurality of transistors in the transistor stack include first and second transistors arranged vertically adjacent to each other in the transistor stack to form a complementary field effect transistor (CFET).

An aspect (10) includes the semiconductor device of aspect (9), wherein: the first transistor is an NMOS transistor having its source and drain regions made from n-doped Si, and having its ferroelectric gate structure made from HfXZr1-XO as the ferroelectric material; and the second transistor is a PMOS transistor having its source and drain regions made from p-doped SiGe, and having its ferroelectric gate structure made from HfYZr1-YO as the ferroelectric material, where X and Y of the ferroelectric materials are different from one another.

An aspect (11) includes the semiconductor device of aspect (10), wherein the core dielectric includes a ferroelectric material.

An aspect (12) includes the semiconductor device of aspect (9), wherein the first and second transistors have vertical channel structures made from the same type of semiconductor material.

An aspect (13) includes the semiconductor device of aspect (9), wherein the first and second transistors have ferroelectric gate structures made from the same type of ferroelectric material.

An aspect (14) provides a method of fabricating a semiconductor device, the method including: forming a multilayer stack on a substrate, the multilayer stack including alternate metal layers and dielectric layers; forming at least one opening through the multilayer stack to uncover the substrate and provide an opening sidewall that exposes each of the metal layers; forming a plurality of recessed ferroelectric gate structures within the opening, each recessed ferroelectric gate structure being in contact with a respective one of the metal layers and recessed from the opening sidewall; forming a plurality of vertical channel structures on the opening sidewall, each vertical channel structure having a first channel sidewall in contact with a respective ferroelectric gate structure to form a respective vertical channel transistor such that a transistor stack including a plurality vertical channel transistors is formed in the opening; and forming a back gate structure for the transistor stack within the opening, the back gate structure being formed on a second channel sidewall of the vertical channel structures which is opposite to the first channel sidewall of the vertical channel structures.

An aspect (15) includes the method of aspect (14), wherein the forming a plurality of recessed ferroelectric gate structures includes: laterally recessing a plurality of exposed metal layers to form a plurality of respective gate recesses on the opening sidewall; and forming a ferroelectric gate structure within each respective gate recess and in contact with the respective metal layers.

An aspect (16) includes the method of aspect (15), wherein the forming a ferroelectric gate structure includes forming a gate electrode and a gate dielectric within each respective gate recess.

An aspect (17) includes the method of aspect (16), wherein the forming a ferroelectric gate structure further includes forming a gate electrode interface liner within each recess and interposed between a respective gate electrode and the gate dielectric.

An aspect (18) includes the method of aspect (15), further including forming a recessed source structure and a recessed drain structure arranged on upper and lower sides of a respective recessed gate structure and in contact with the first channel sidewall of a respective vertical channel structure.

An aspect (19) includes the method of aspect (18), wherein the forming a back gate structure includes: forming a back gate dielectric in contact with the second channel sidewall of each vertical channel structure; and forming a back gate electrode in contact with the back gate dielectric.

An aspect (20) includes the method of aspect (14), wherein: the forming a plurality of recessed ferroelectric gate structures includes forming each gate structure as an annular ring gate structure having an outer sidewall in contact with the respective one of the metal layers; and the forming a plurality of vertical channel structures includes forming each vertical channel structure as a tube-shaped semiconductor structure having an outer sidewall in contact with an inner sidewall of a respective one of the annular ring gate structures; and the forming a back gate structure includes forming a core electrode extending along the vertical direction and passing through an opening of each tube-shaped semiconductor structure, and forming a core dielectric structure contacting the core conductor and an inner wall of each respective tube-shaped semiconductor structure.

BRIEF DESCRIPTION OF THE DRAWINGS

Various embodiments of this disclosure that are proposed as examples will be described in detail with reference to the following figures, wherein like numerals reference like elements. The sizes and relative positions of elements in the drawings are not necessarily drawn to scale.

FIG. 1A is a cross-sectional view taken along the line cut X-X' according to some embodiments of the disclosure.

DETAILED DESCRIPTION

Figure 1A:
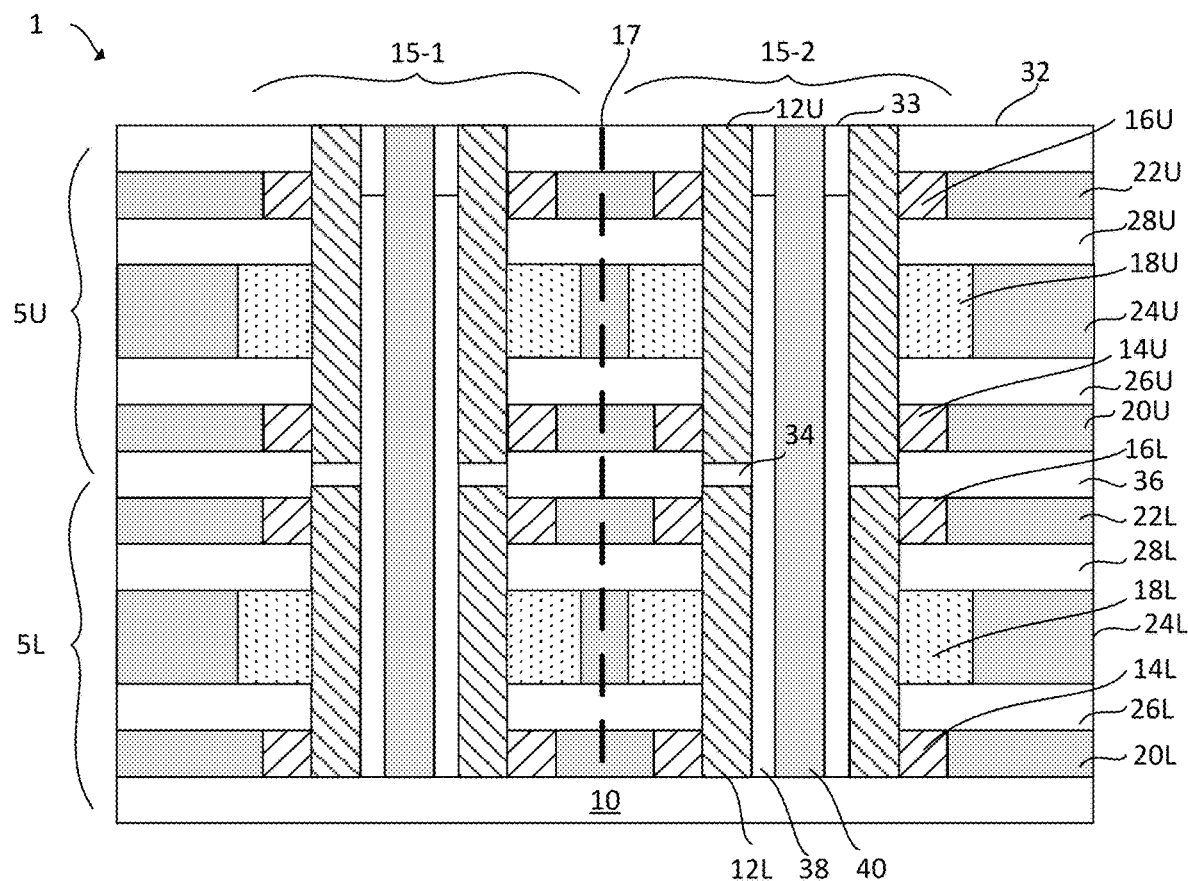
FIG. 1A is a cross-sectional view of an exemplary semiconductor device according to an example embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

As noted in the Background, 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on chip)) is being pursued.

Figure 1B:
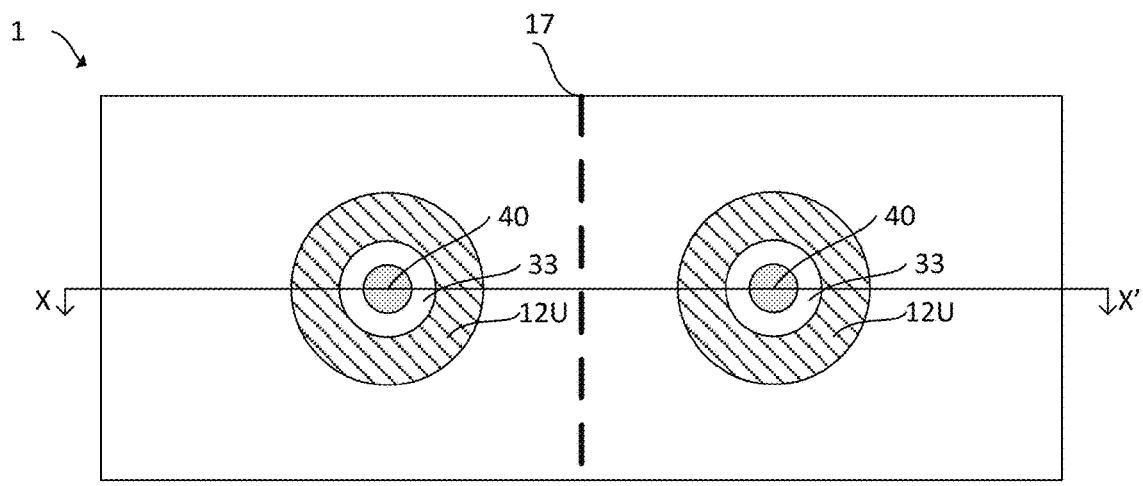
FIG. 1B is a top-down view of the exemplary semiconductor device in FIG. 1A where

Techniques disclosed herein provide a transistor stack of vertical channel ferroelectric field effect transistors (FeFET) with a back gate. FIG. 1A is a cross-sectional view of an exemplary semiconductor device according to example embodiments of the disclosure, and FIG. 1B is a top-down view of the exemplary semiconductor device in FIG. 1A. As shown, the semiconductor device 1 includes a substrate 10 having lower transistors 5L formed on the substrate and upper transistors 5U formed on the lower transistors to form transistor stacks. While two transistors are illustrated in each stack 15-1, 15-2, any number of transistors may be provided within a stack. The substrate 10 can be a wafer of any semiconductor material and/or any dielectric material. In the example shown, two transistor stacks 15-1 and 15-2 are formed on the substrate 10 laterally adjacent to one another, however, any number of stacks may be formed on the substrate. Isolation between the transistor stacks is schematically depicted by the dashed line 17. Each The stacks 15-1 and 15-2 are identical to each other, so only one stack will be described.

Each transistor in each of the stacks is a vertical channel ferroelectric field effect transistor (FeFET). In the example shown, the lower transistor 5L in the stack 15-2 includes a vertical channel structure 12L and source/drain (S/D) regions 14L, 16L vertically spaced from each other and provided on top and bottom sides of the ferroelectric gate structure 18L in contact with the vertical channel structure 12L to provide a vertical current path for the lower transistor 5L. The ferroelectric gate structure 18L provided between the S/D regions 14L, 16L is in contact with a middle region of vertical channel structure 12L. S/D interconnects 20L, 22L contact respective S/D regions 14L, 16L of the lower transistor, and gate interconnect 24L contacts ferroelectric gate structure 18L of the lower transistor. Dielectric spacers 26L and 28L are arranged to isolate the ferroelectric gate structure 18L and gate interconnect 24L from adjacent S/D regions and their associated S/D interconnects.

In the example shown, the upper transistor 5U includes a vertical channel structure 12U and source/drain (S/D) regions 14U, 16U vertically spaced from each other and provided on top and bottom sides of the ferroelectric gate structure 18U in contact with the vertical channel structure 12U to provide a vertical current path for the upper transistor 5U. The ferroelectric gate structure 18U is provided between the S/D regions 14U, 16U is in contact with a middle region of vertical channel structure 12U. S/D interconnects 20U, 22U contact respective S/D regions 14U, 16U of the upper transistor, and gate interconnect 24U contacts ferroelectric gate structure 18U of the upper transistor. Dielectric spacers 26U and 28U are arranged to isolate the ferroelectric gate structure 18U and gate interconnect 24U from adjacent S/D regions and their associated S/D interconnects. Dielectric capping layer 32 is also provided.

As seen in the top view of FIG. 1B, the vertical channel structures 12L and 12U are circular in shape. That is, each of the vertical channel structures is a tube structure extending along a vertical direction that is perpendicular to the surface of the substrate 10. In alternative embodiments, the tube structure may be non-circular in the top view. Further non-tubular vertical channel structures such as vertically oriented nanosheets may be used. Back gate metal 40 is provided as a core to the tubular vertical channel structures, and core dielectrics 33 and 38 are provided as annular rings around the core metal 40 to insulate the back gate metal 40 from the vertical channels 12L and 12U. Channel isolation dielectric 34 isolates the lower channel 12L from the upper channel 12U, and isolation dielectric 36 isolates the S/D regions and S/D metals of the lower and upper transistors from one another.

The substrate 10 and vertical channel structures 12L and 12U may be made from semiconductor materials such as Si, Ge, SiGe, GaAs, InAs, InP, semiconductive behaving oxide (e.g. $In_2O_3$, $SnO_2$, InGaZnO, and ZnO, SnO), 2D material (e.g. $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $HfSe_2$, $ZrSe_2$, $HfZrSe_2$, etc.) or any other suitable semiconductor material in monocrystalline and/or polycrystalline form. Further, the vertical channel structures may be doped with either p-type or n-type dopants at various doping concentration levels. The p-type dopant may be boron and the n-type dopant may be phosphorus or arsenic, however other suitable dopant materials may be used. Various techniques may be used to provide a strained channel material to improve carrier mobility, for example. In some embodiments, the vertical channel structure 12L of the lower transistor and the vertical channel structure 12U of the upper transistor may have the same material composition, but in other embodiments, the vertical channel structures 12L and 12U can be different from one another. For example, both vertical channel structures 12L and 12U may be NMOS, both vertical channel structures 12L and 12U may be PMOS, or one of the vertical channel structures 12L and 12U may be NMOS while the other vertical channel structure is PMOS.

The S/D regions 14L, 14U, 16L, 16U may also be made from any semiconductor material in monocrystalline or polycrystalline form and doped with either p-type or n-type dopants at various doping concentration levels. The S/D regions 14L, 14U, 16L, 16U may be made of the same or different semiconductor materials from each other, and may be the same or a different material as their respective vertical channel structures. The S/D regions 14L, 14U, 16L, 16U may have the same or a different doping type as their respective vertical channel structures and may have the same or different doping concentration as their respective vertical channel structures. Various S/D contact engineering techniques known in the semiconductor fabrication art may be employed in the design and formation of S/D regions 14L, 14U, 16L, 16U. For example, the S/D regions may include S/D extensions and/or silicides for reducing S/D contact resistance, for example.

Substrate 10, spacer layers 26L, 26U, 28L, 28U, capping layer 33, channel isolation 34, isolation 36, and core isolation 38 may be implemented as a dielectric material such as SiO, SiN, SiON, SiC, SiOC, SiCN, SiOCN, the like, or a combination thereof. These structures may also be implemented as high-k dielectrics. The same or different dielectric materials can be used for these structures. In some embodiments, the core dielectric 38 may be a ferroelectric material.

S/D interconnects 20L, 20U, 22L, 22U, gate interconnect 24L, 24U and back gate 40 may be made of any conductive material, such as a doped polysilicon material or a metal such as W, Co, Ru, Cu, Al, the like, or combinations thereof. The same or different conductor materials can be used for these structures.

Each of the ferroelectric gate structures 18L, 18U includes at least a gate dielectric which includes a ferroelectric material such as $Pb(Zr_xTi_{1-x})O_3$ (PZT) or hafnium-zirconium oxide (HZO), but any suitable ferroelectric material may be used. In some embodiments $Hf_xZr_{1-x}O$ and/or $Hf_yZr_{1-y}O$ may be included in the ferroelectric gate dielectric. Additional dielectrics such as $SiO_2$ and/or high-k materials such as $HfO_2$, $ZrO_2$, $HfSiNO_2$, $ZrSiNO_2$, $Y_3O_4$, $Si_3N_4$, and/or $Al_2O_3$ may be included in the ferroelectric gate dielectric. Where the ferroelectric gate structures 18L, 18U include only a gate dielectric, the gate interconnects 24L, 24U can serve as gate electrodes for their respective transistor.

In some embodiments, the ferroelectric gate structures 18L, 18U also include a gate electrode structure in contact with the gate interconnect layers 24L, 24U. The gate electrode structures can include one or more work function layers (e.g., TiC, TiON, AlTiN, AlTiC, AlTiO, or the like), one or more liners (e.g., TiN, TaN, or the like), and one or more filler metals (W, Co, Ru or the like). In some embodiments where the transistor is an n-type transistor, the gate electrode layer can include a work function layer (e.g., TiC, AlTiC, AlTiO), a liner (e.g., TiN), and a filler (e.g., W or Ru). In some embodiments where the transistor is a p-type transistor, the gate electrode can include a work function layer (e.g., TiON, TiC, AlTiN, AlTiC, AlTiO), a liner (e.g., TiN and/or TaN), and a filler (e.g., W or Ru). In some embodiments, the ferroelectric gate structures 18L, 18U may be implemented as a multilayer gate stack including one or more layers of dielectric, conductive, and ferroelectric materials, any one of which may be in direct contact with the vertical channel structure.

According to some embodiments of the semiconductor device 1, the ferroelectric channel and gate electrode materials will provide improved transistor properties for both NMOS and PMOS devices. In one embodiment, the transistor stacks 15-1, 15-2 provide complementary field effect transistors (CFET) for logic applications. A full oxide core and back gate feature can provide vertical thin channels for high-speed devices. The back gate feature used with a ferroelectric material permits the state of the ferroelectric material to be altered to provide multiple threshold voltages Vt for NMOS and PMOS devices. Thus, the back side of the vertical channel with ferroelectric material enables setting Vt by back bias for NMOS and PMOS devices.

Figure 2:
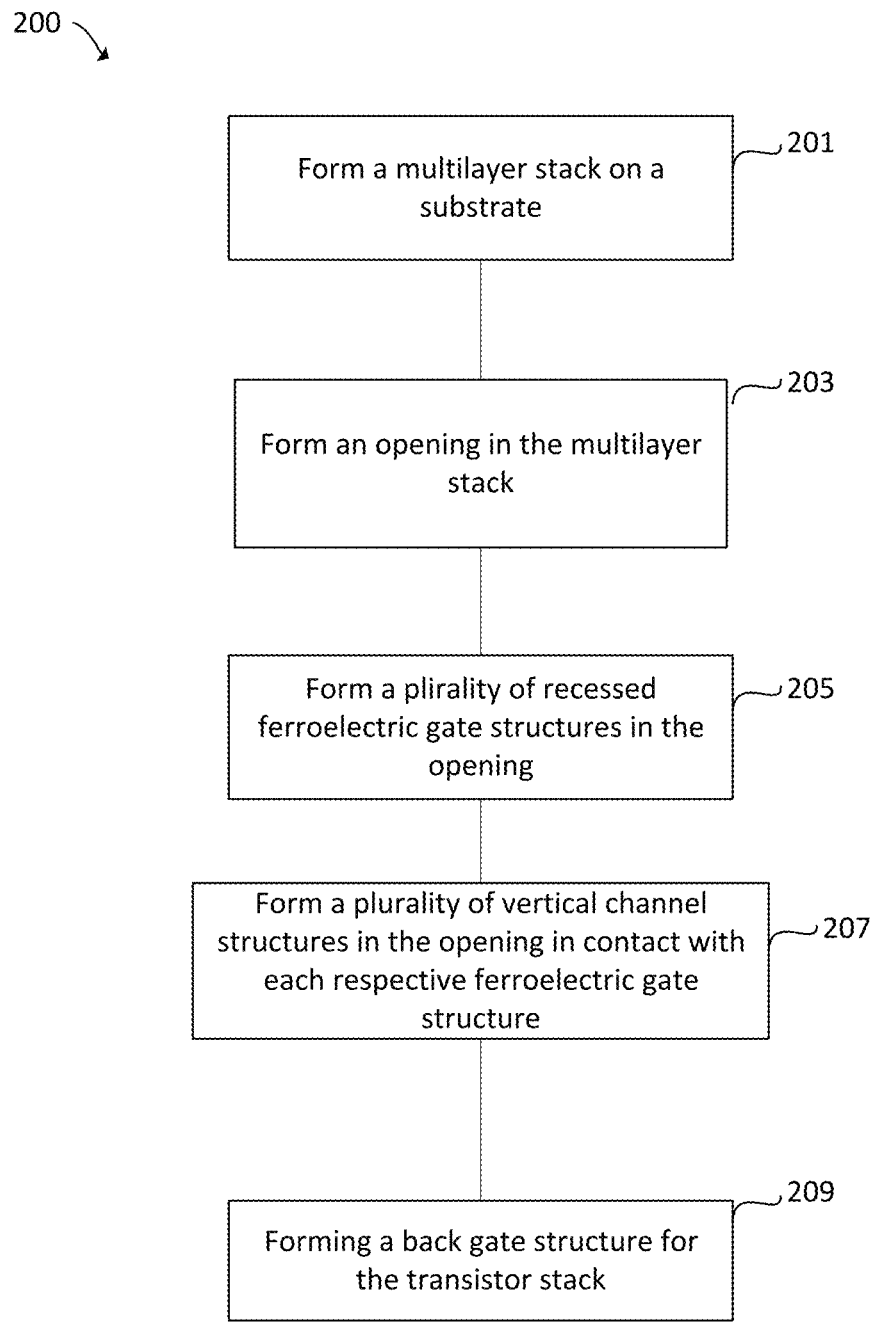
FIG. 2 is a process flow diagram of an example method of forming a semiconductor device in accordance with embodiments of the disclosure.

FIG. 2 is a process flow diagram of an example method of forming a semiconductor device in accordance with embodiments of the disclosure. The method 200 includes step 201 of forming a multilayer stack on a substrate, the multilayer stack including alternate metal layers and dielectric layers. Conventional thin film deposition techniques may be used to form the multilayer stack, such as chemical vapor deposition (CVD), low pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, for example. Moreover, techniques of thin film formation may include growing a film in-situ such as growth of an oxide to a desired thickness, for example. Formation of the films may be conformal or area selective based on material compositions, for example.

In step 203, at least one opening is formed through the multilayer stack to uncover the substrate and provide an opening sidewall that exposes each of the metal layers in the multilayer stack. Conventional etching techniques such as wet chemical etching, reactive ion (plasma) etching (RIE), washing, wet cleaning, pre-cleaning, spray cleaning, and/or chemical-mechanical planarization (CMP) may be used to form the at least one opening. Etching may be directional or area selective based on material compositions, for example. Further, such etch processes, particularly directional etch processes, may be preceded by conventional photolithography techniques for patterning. Photolithography can also be used to pattern a hard mask which, in turn, can be used to pattern an underlying film.

In step 205, a plurality of recessed ferroelectric gate structures is formed within the opening. Each recessed ferroelectric gate structure is in contact with a respective one of the metal layers and laterally recessed from a sidewall of the opening. Lateral recessing of the metal layers may include a selective etch process and forming of the ferroelectric gate structure within a recess may include a selective deposition process. In some embodiments, the recessed ferroelectric structures for each transistor in the stack are formed after formation of S/D regions of the transistors.

In step 207, a plurality of vertical channel structures is formed on the sidewall opening. Each vertical channel structure has a first side in contact with a respective ferroelectric gate structure to form a vertical channel transistor such that a transistor stack of two or more vertical channel transistors is formed in the opening. In step 209, a back gate structure for the transistor stack is formed within the opening. The back gate structure is formed on a second side of the vertical channel structures which is opposite to the first side of the vertical channel structures that contacts the ferroelectric gate structure. Formation of the back gate structure may include deposition of a ferroelectric material as the back gate dielectric.

According to some embodiments of the process 200, use of a selective etch process to form the ferroelectric gate structure and/or S/D regions of the vertical channel transistors eliminates many masking layers. Further, some embodiments of the process 200 permit all of the vertical NMOS gate electrodes to be formed in one process sequence, and all of the vertical PMOS gate electrodes may be formed in one process sequence. Similarly, some embodiments of the process 200 permit all NMOS S/D regions to be formed in a single process, and all of the NMOS S/D regions to be formed in one process. Thus embodiments of the process 200 enable a substantial 3D stacking build.

Figure 3A:
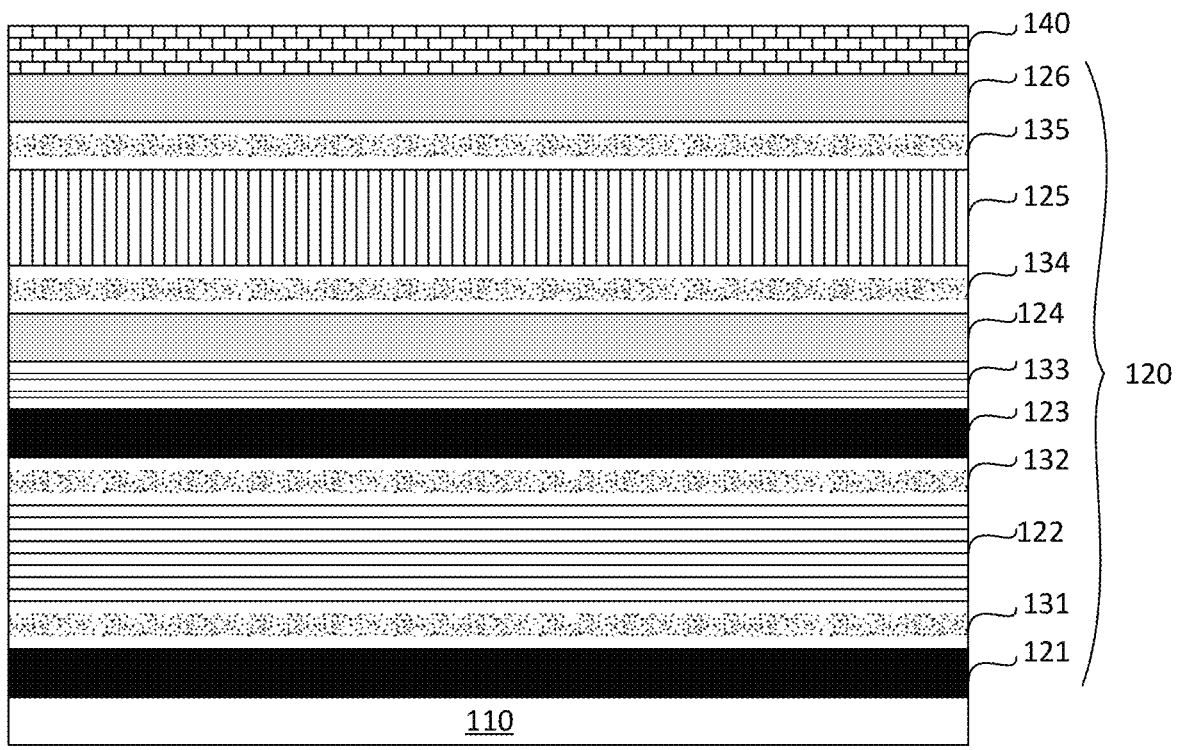
FIG. 3A, 3B, 3C, 3D, 3E, 3F, 3G, 3H, 3I, 3J, 3K, 3L, 3M, 3N, 3O, and 3P are schematic cross-sectional views of intermediate structures in an example process flow for forming a semiconductor device according to an example embodiment of the disclosure.
Figure 3B:
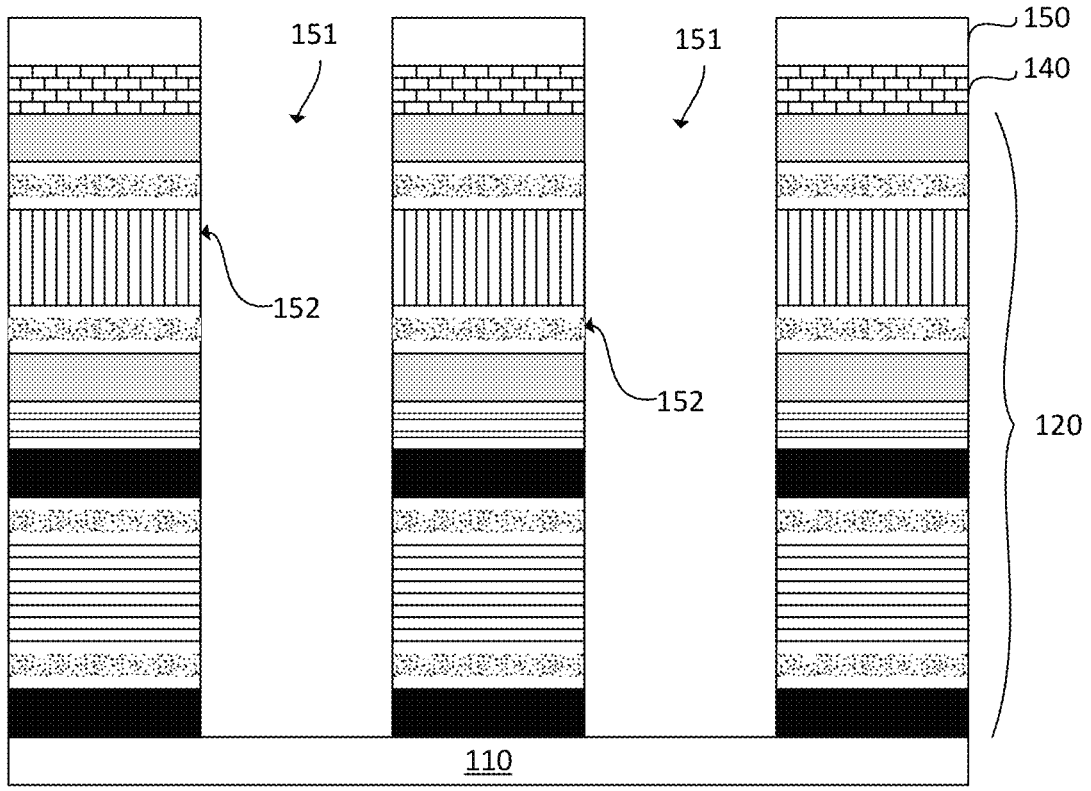
Figure 3C:
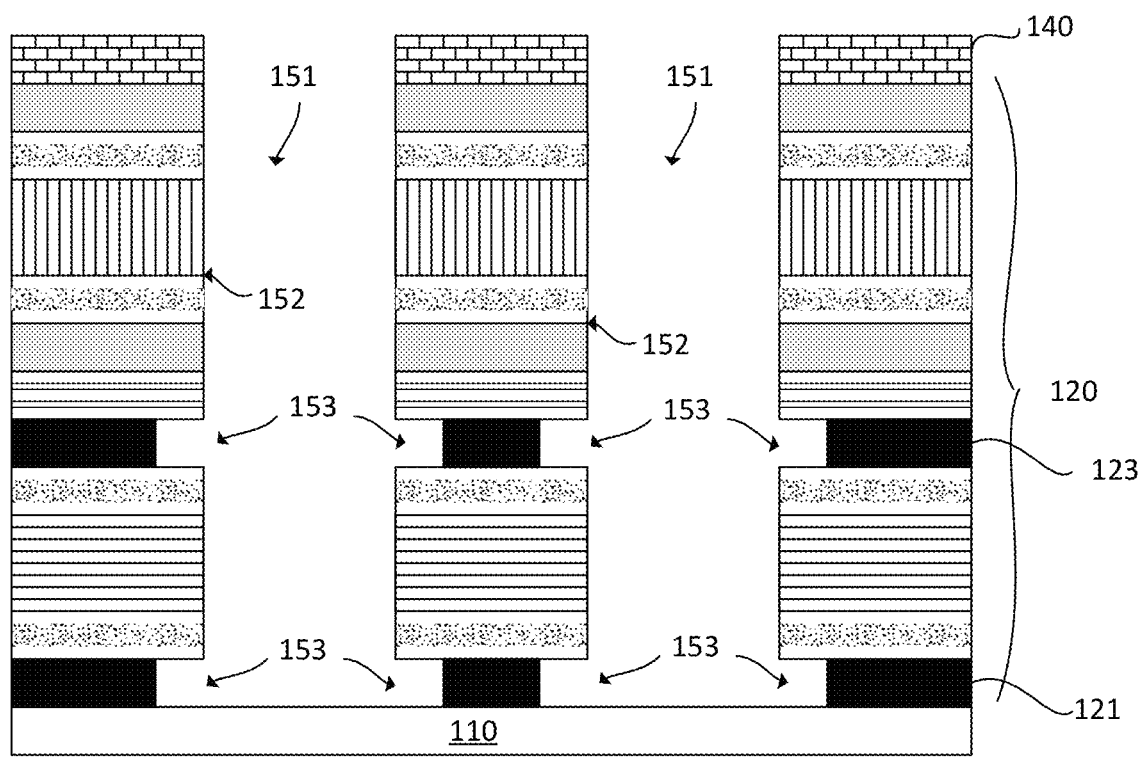
Figure 3D:
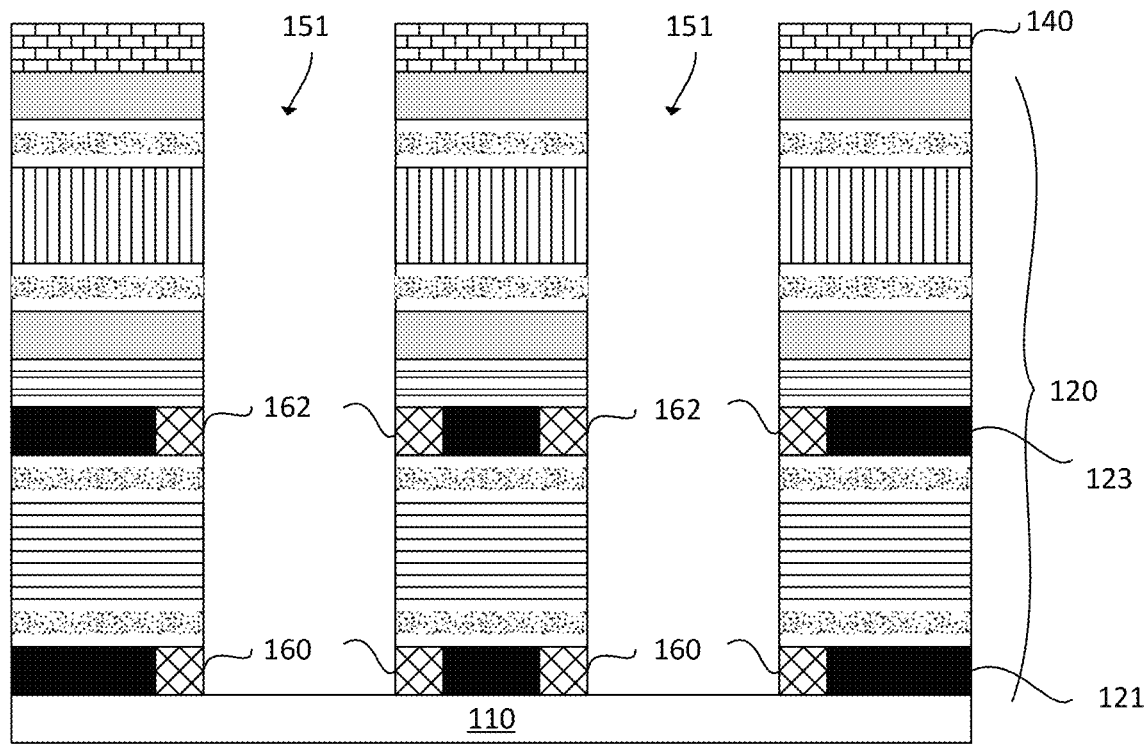
Figure 3E:
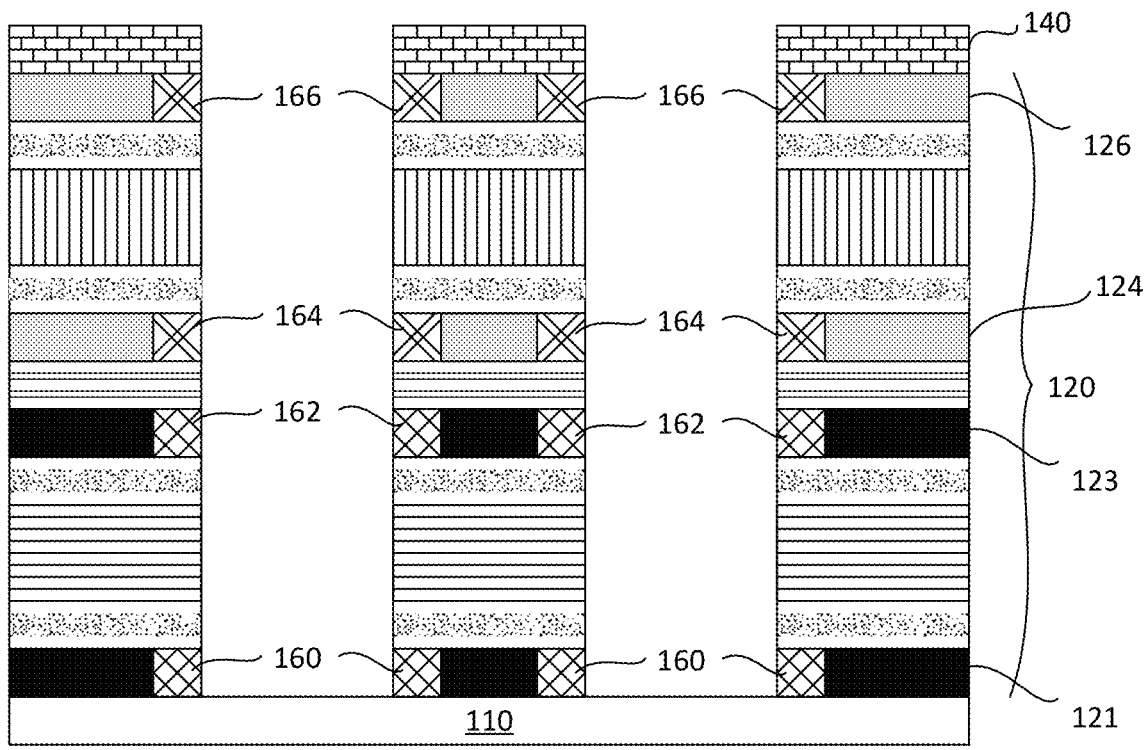
Figure 3F:
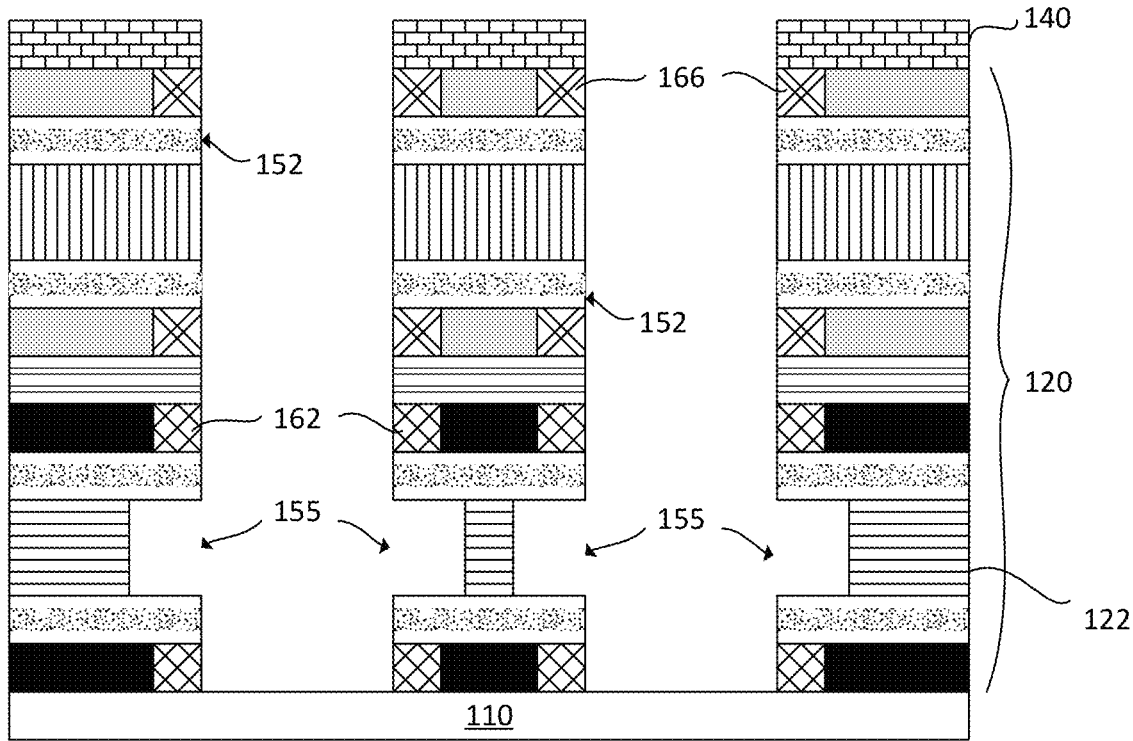
Figure 3G:
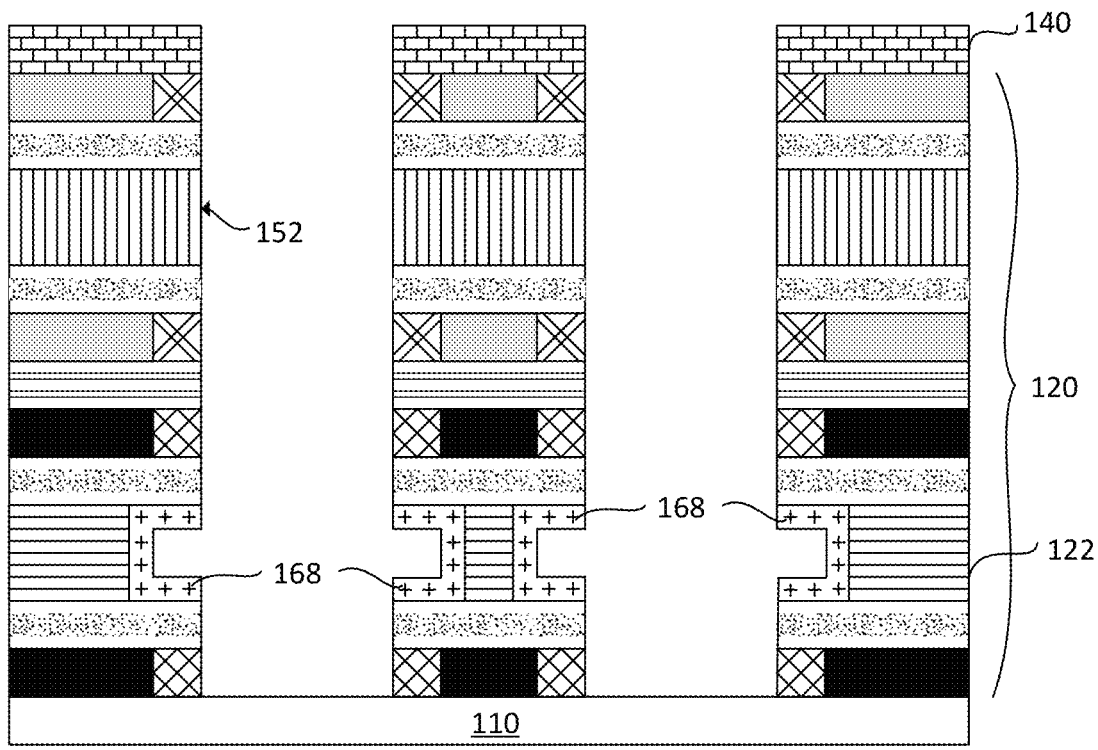
Figure 3H:
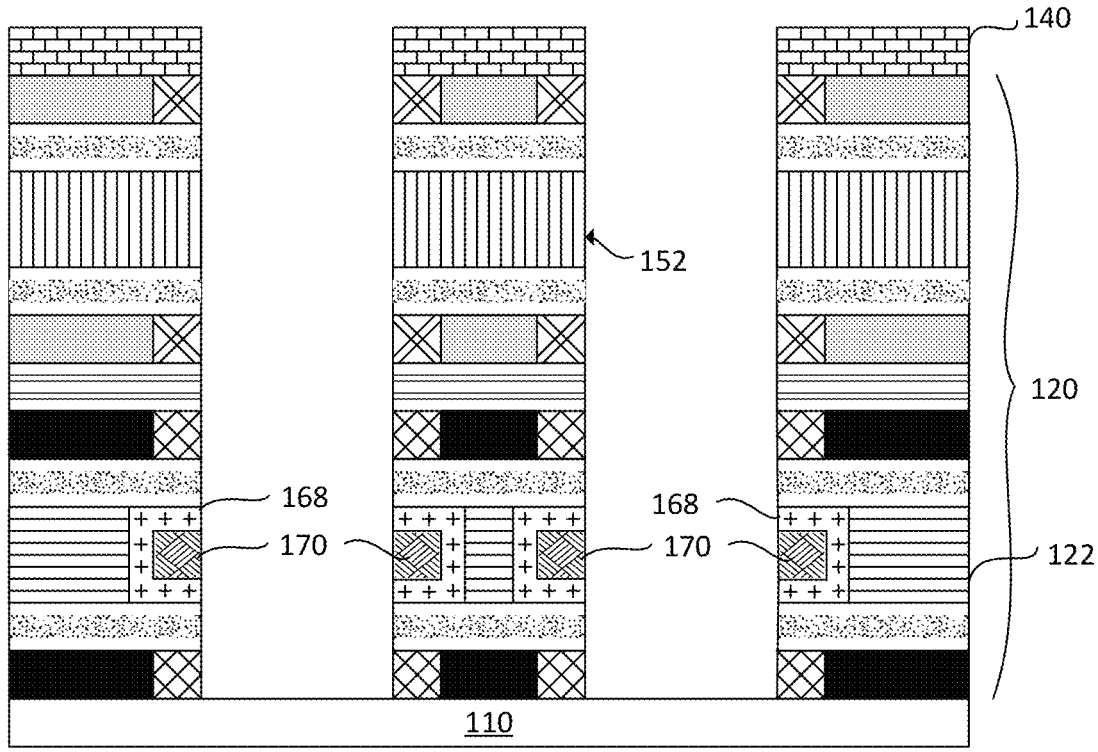
Figure 3I:
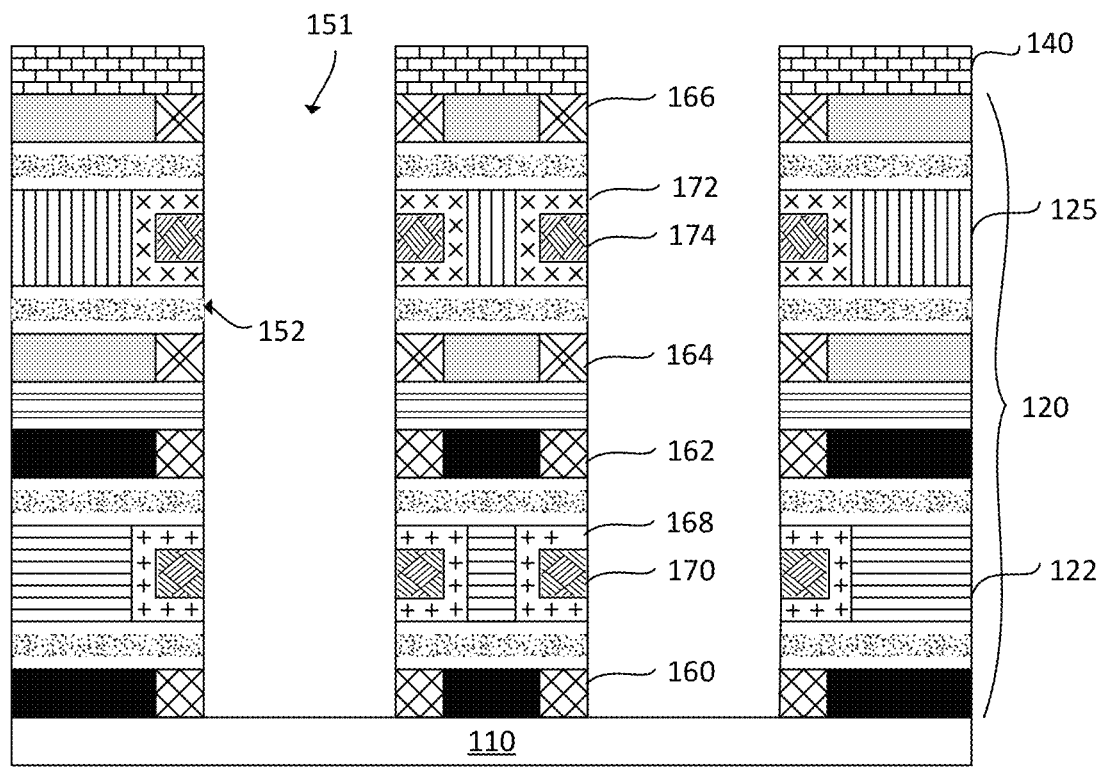
Figure 3J:
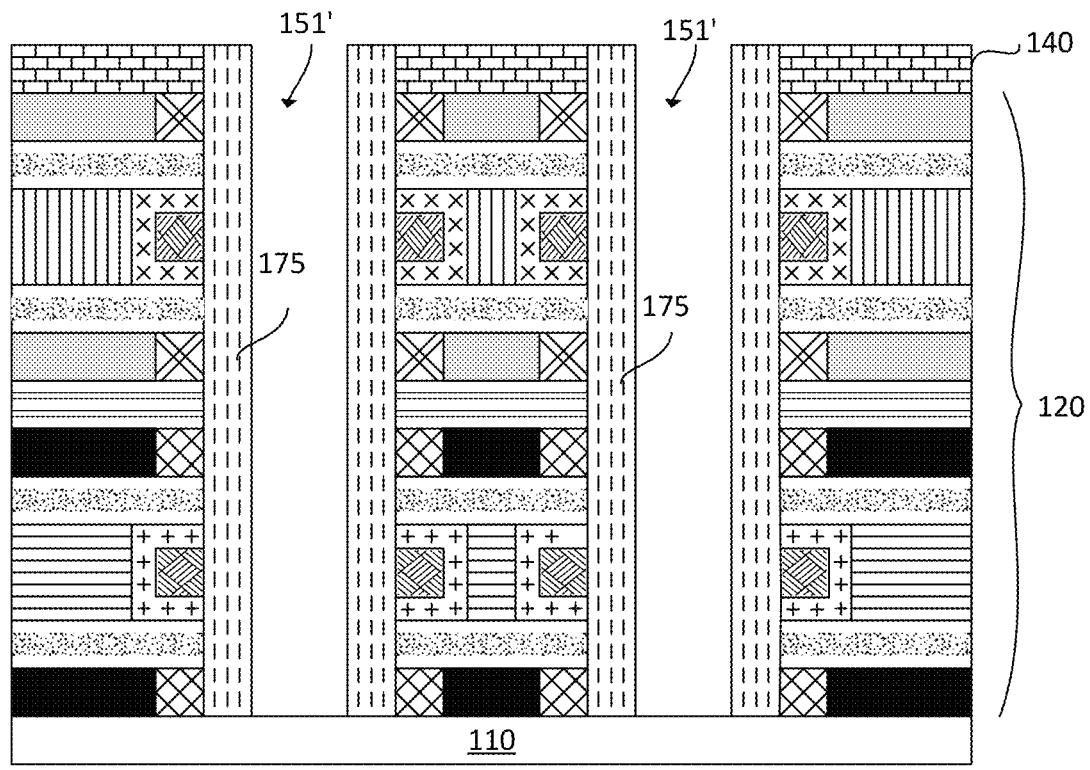
Figure 3K:
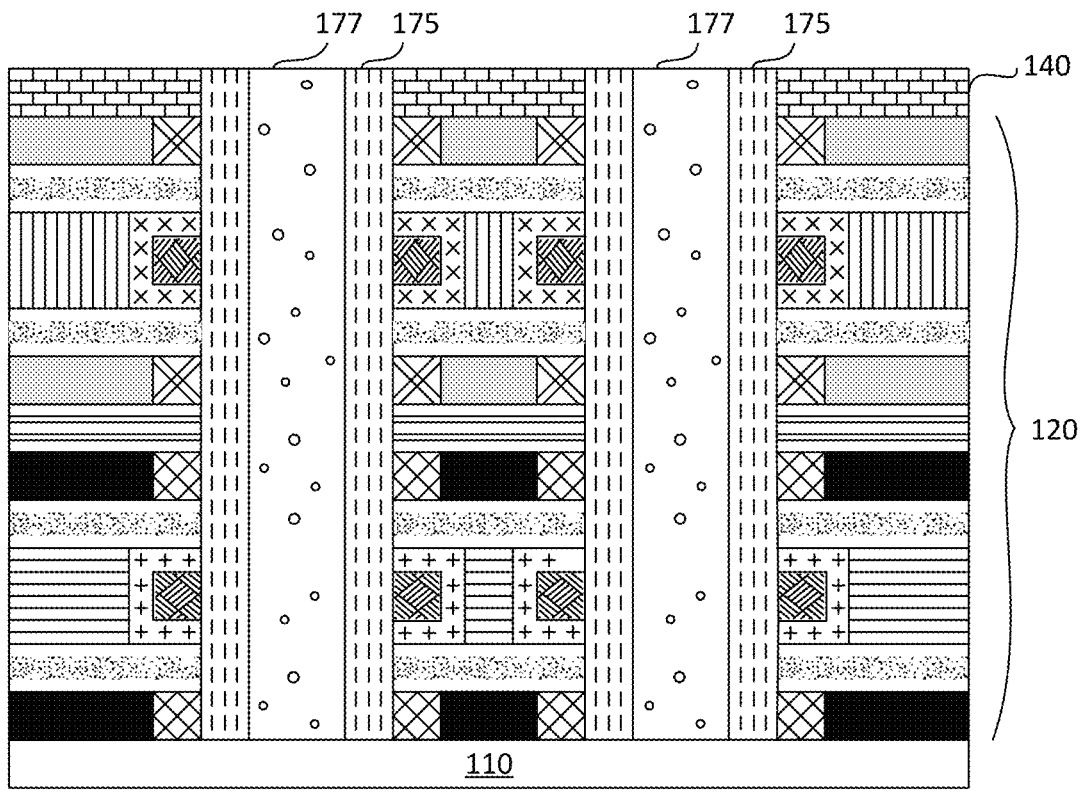
Figure 3L:
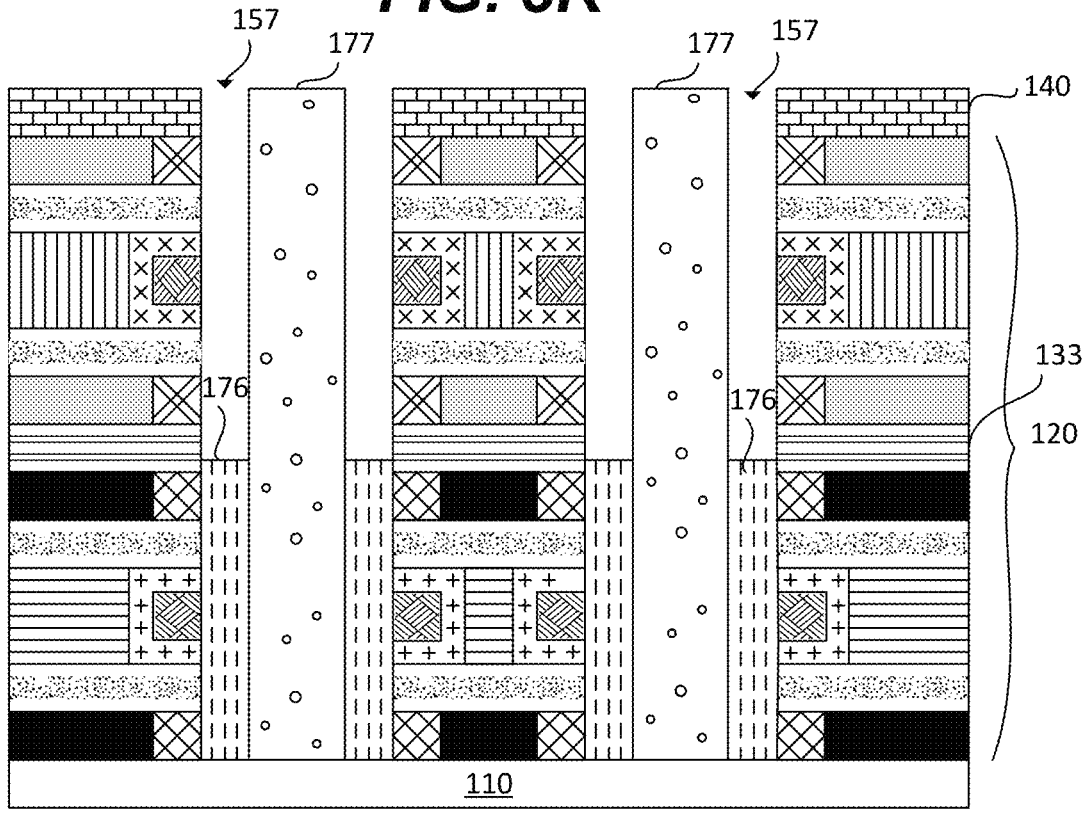
Figure 3M:
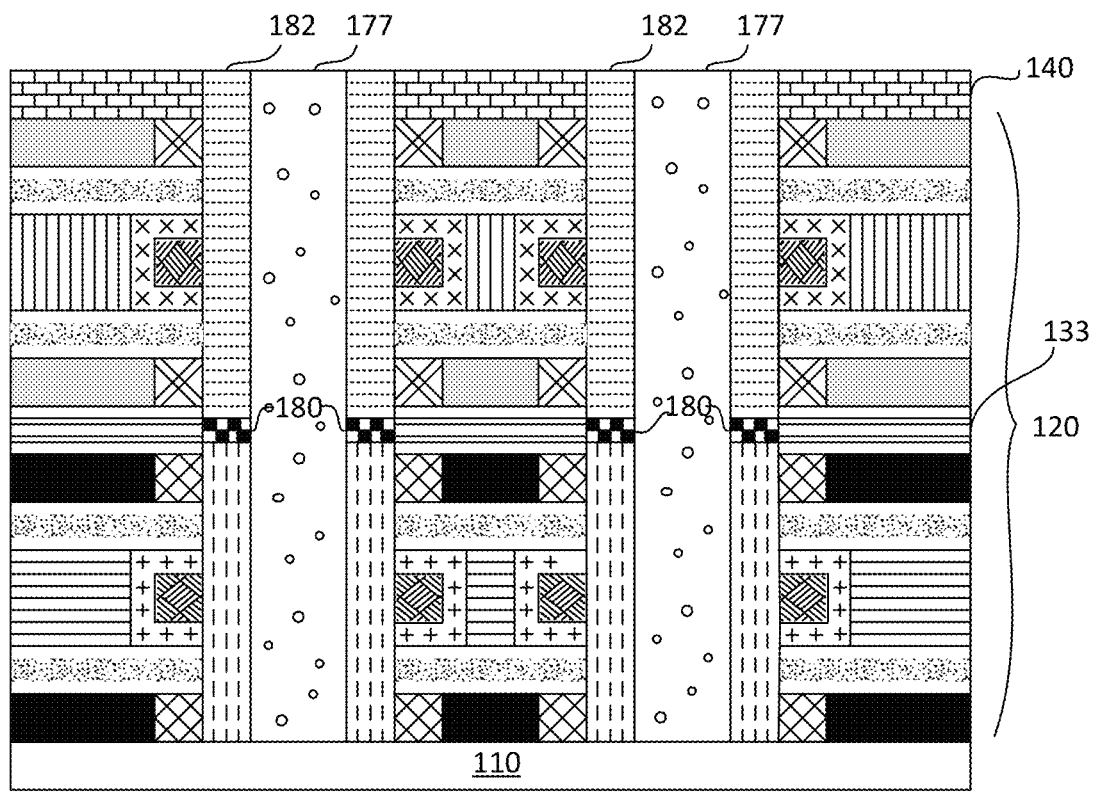
Figure 3N:
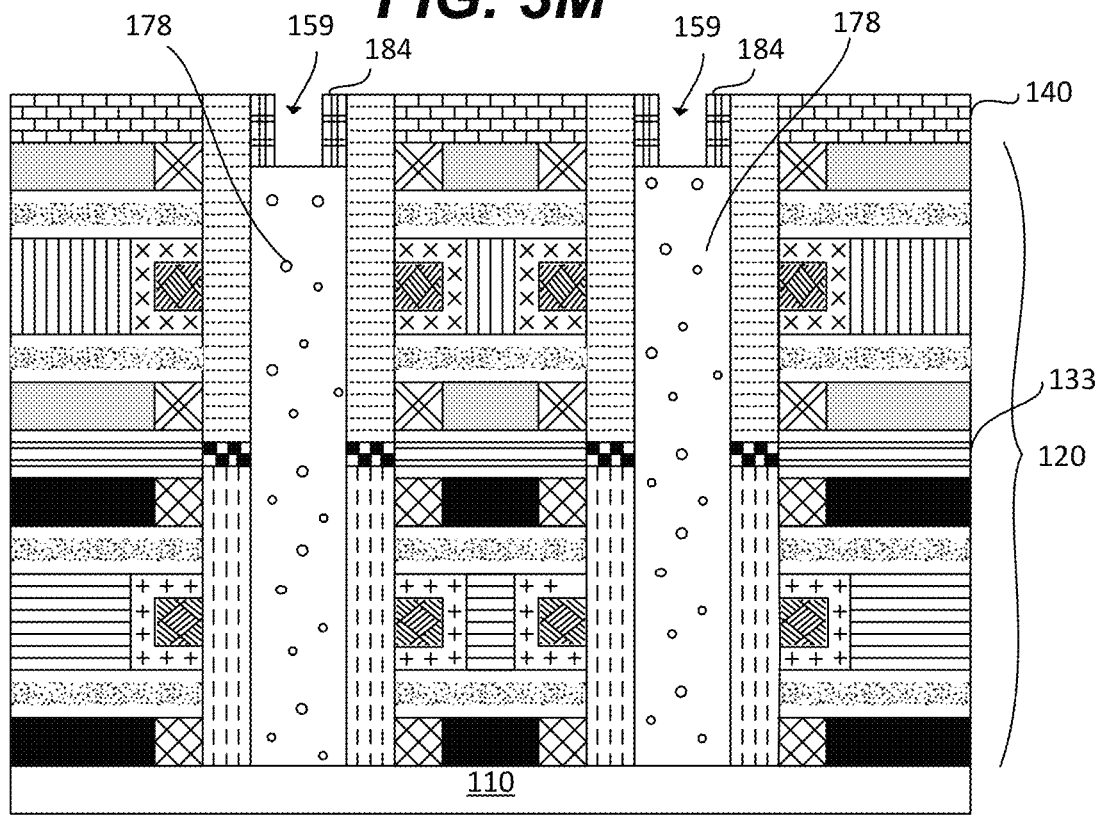
Figure 3O:
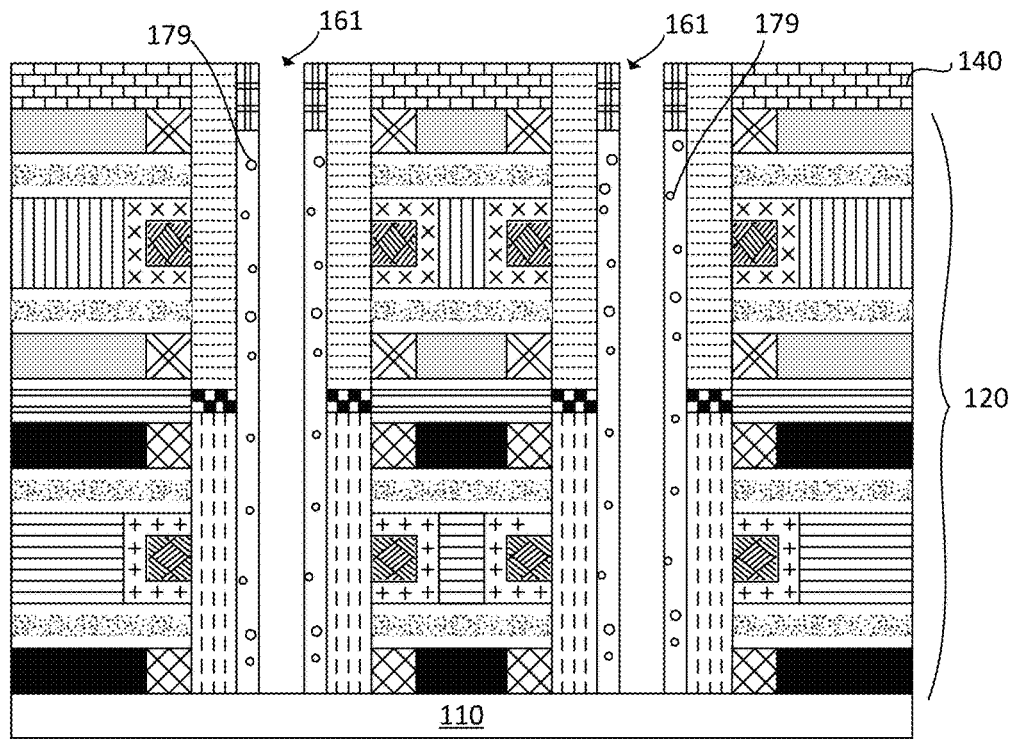
Figure 3P:
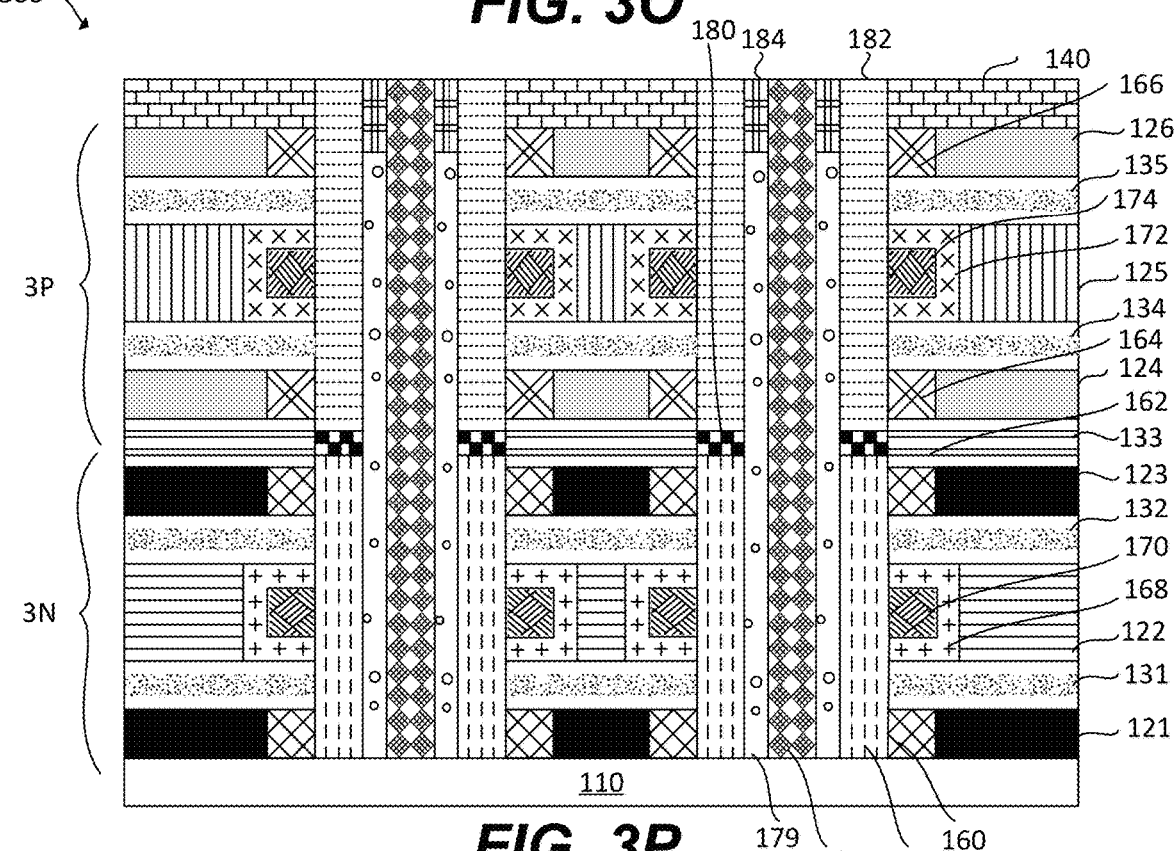

FIGS. 3A-3P are cross-sectional views of intermediate structures in a process flow for forming a semiconductor device in accordance with an example embodiment of the disclosure. The example of FIGS. 3A-3P uses different ferroelectric materials in the ferroelectric gate structure for NMOS and PMOS devices, with a back gate electrode and different channel materials for NMOS and PMOS devices.

FIG. 3A is a cross-sectional view illustrating a starting structure for forming a semiconductor device according to example embodiments of the disclosure. The structure includes a substrate or base layer 110, a multilayer stack 120 formed on the substrate 110 and a capping layer 140 formed on the multilayer stack 120. In the embodiment of FIG. 3A, the base 110 is a dielectric, and the capping layer 140 includes a high-k material. The multilayer stack 120 includes alternate metal layers and dielectric layers. In the illustrated example, the multilayer stack 120 includes first to sixth metal layers 121-126 and first to fifth dielectric layers 131-135 that alternate with the first to sixth metal layers 121-126. The first to sixth metal layers 121-126 will provide connections and routing to source, gate and drain regions of each transistor in the transistor stacks. More specifically, in the illustrated example, the multilayer stack 120 includes base dielectric layer 110, NMOS S/D metal layer 121, dielectric spacer layer 131, NMOS gate metal layer 122, dielectric spacer layer 132, NMOS S/D metal layer 123, vertical dielectric isolation layer 133, PMOS S/D metal layer 124, dielectric spacer layer 134, PMOS gate metal layer 125, dielectric spacer layer 135, and PMOS S/D metal layer 126. In the embodiment of FIG. 3A, layers having the same material composition are illustrated with the same shading or pattern. Different dielectric materials and different metal materials can be used to facilitate selective etch or selective deposition steps in the example process flow.

FIG. 3B is a cross-sectional view illustrating etching of the multilayer stack 120 according to some embodiments of the disclosure. An etching process is performed and a portion of the multilayer stack 120 that is not protected by the etch mask 150 are etched to form at least one opening through the multilayer stack 120 until uncovering the top surface of the substrate 110, for the vertical channel structures to be formed within. In the illustrated embodiment, two openings 151 are formed. The etch mask 150 can be formed on the capping layer 140 and subsequently patterned using photolithography. Materials for the etch mask 150 can be organic or inorganic. Examples of organic materials for the etch mask 150 can include amorphous carbon or organo siloxane-based materials with reflection control properties, among others. The organic etch mask can be formed by chemical vapor deposition (CVD) or spin-on processes. Examples of inorganic materials for the etch mask 150 can include SiN, SiON or TiN, among others. The inorganic etch mask can be deposited through CVD process.

FIG. 3C is a cross-sectional view illustrating an NMOS metal indent etch according to some embodiments of the disclosure. The etch mask 150 can be removed and the multilayer stack 120 can be cleaned prior to the etch indent step. A selective etch is performed to etch the NMOS S/D metals 121, 123 while leaving the other layers in the multilayer stack 120 unetched. The selective metal etch results in metal indents or recesses 153 in the NMOS S/D metals 121, 123. That is, the exposed NMOS S/D metal layers 121, 123 are laterally recessed with respect to the sidewalls 152.

FIG. 3D is a cross-sectional view illustrating formation of NMOS S/D regions in accordance with some embodiments of the disclosure. In the example of FIG. 3D, N+ poly is deposited in the metal indents 153 to form NMOS S/D regions 160, 162. In one embodiment, the N+ poly material is deposited in the openings until the metal indents 153 are filled, and an etch aligned to capping layer 140 is performed to leave the N+ poly material only within the indents 153. The N+ poly material may be deposited to fill each opening 151, or selectively deposited on the NMOS metal 121, 123 in sufficient amount to fill the recesses 153. The N+ poly material forms S/D regions 160, 162 that provide S/D hookups to future vertical channel NMOS regions. Any N+ semiconductor suitable for NMOS may be used.

FIG. 3E is a cross-sectional view illustrating a structure after formation of PMOS S/D regions in accordance with embodiments of the disclosure. PMOS regions 164, 166 are formed by a similar process to that of the NMOS S/D regions 160, 162 as described above. For example, PMOS S/D metal 124, 126 can be selectively etched to form PMOS metal indents, followed by P+ SiGe deposition within the openings 151 to fill recesses, and a directional etch. This process forms the PMOS S/D regions 164, 166 to establish channel S/D connections to future PMOS vertical channel regions. Any P+ deposited semiconductor that is suitable for PMOS may be used. In some embodiments, a selective deposition of the NMOS S/D regions and subsequent deposition of the PMOS S/D regions 164, 166 can be sequentially performed, followed by a single directional etch to remove any overfill from the sidewalls 152.

FIG. 3F is a cross-sectional view illustrating an NMOS gate metal recess according to some embodiments of the disclosure. A selective etch is performed to etch the NMOS gate metal 122 while leaving the other layers in the multilayer stack 120 unetched. The selective metal etch results in metal indents or recesses 155 in the NMOS gate metal 122. A ferroelectric gate metal structure for NMOS will be formed in each recess 155.

In the illustrated embodiment, the ferroelectric gate structure for NMOS includes a gate electrode interface liner and a ferroelectric gate dielectric. FIG. 3G is a cross-sectional view illustrating the formation of a gate electrode interface liner in accordance with an example embodiment of the disclosure. In one embodiment, the gate electrode interface liner material is selectively deposited within the gate metal indent 155 to cover a NMOS gate electrode interface, and a directional etch aligned to the capping layer 140 is performed to provide the gate electrode interface liner 168. The gate electrode interface liner 168 may be implemented as a stack of materials provided between the ferroelectric material and the gate electrode bulk metal. For example, the gate electrode interface liner 168 may include work function metal layers (for example 2 different work function metal layers), barrier layers, liners etc. at the interface between the ferroelectric material and the gate metal layer. FIG. 3H is a cross-sectional view illustrating forming of the ferroelectric gate dielectric for NMOS in accordance with example embodiments of the disclosure. The ferroelectric material for NMOS is deposited on the gate electrode interface liner 168, and then a directional etch aligned to capping layer 140 removes overfill leaving the ferroelectric dielectric 170 within the recess 155. The ferroelectric material for NMOS may be deposited to fill each opening 151, or selectively deposited on the gate electrode interface 168 in sufficient amount to fill the recesses 155. One example of ferroelectric material for NMOS is $Hf_xZr_{1-x}O$, but any compatible NMOS ferroelectric material may be used. Also stacks of high-k dielectrics may be used as noted with respect to FIG. 1A above.

FIG. 3I is a cross-sectional view illustrating formation of the PMOS gate electrode regions in accordance with example embodiments of the disclosure. PMOS gate electrode regions are formed by a similar process to that of the NMOS gate electrode regions described above. For example, a PMOS metal indent etch can be performed on the PMOS gate metal layer 125, followed by forming the gate electrode interface liner 172 and ferroelectric material for PMOS 174. In the embodiment of FIG. 3I, the ferroelectric material for PMOS 174 is $Hf_yZr_{1-y}O$, different than the ferroelectric material for the NMOS. Gate electrode interface liner thickness and material may also be different for the PMOS. In some embodiments, a selective deposition of the ferroelectric material for NMOS and subsequent selective deposition of the ferroelectric material for PMOS can be sequentially performed, followed by a single directional etch to remove any overfill from the sidewalls 152.

FIG. 3J is a cross-sectional view illustrating deposition of N+ channel material for forming a future NMOS vertical channel structure according to some embodiments of the disclosure. The N+ channel material is deposited within opening 151, and then mask etched to form openings 151' leaving a cylindrical structure 175 of N+ material on the sidewalls 152 within the opening 151. In the embodiment of FIG. 3J, the N+ channel material is N+ poly, but any suitable semiconductor material for an NMOS channel may be used. As examples, an oxide semiconductor and/or 2D material may additionally or alternatively be used.

FIG. 3K is a cross-sectional view illustrating deposition of a core isolation material for forming a back gate dielectric in a future back gate structure of a transistor stack. The core isolation material is deposited within openings 151', and any overfill is CMP etched to planarize the substrate leaving preliminary core isolation structure 177 within the opening 151'. FIG. 3L is a cross-sectional view illustrating formation of the vertical channel structure for NMOS transistors. The cylindrical structure 175 of N+ poly is etched using the capping layer 140 and preliminary isolation structure 177 as a mask. The cylindrical structure 175 of N+ poly is etched to a depth of the exposed isolation layer 133, leaving the NMOS vertical channel structure 176 of N+ poly and a cylindrical opening 157 around the preliminary isolation 157 as shown.

FIG. 3M is a cross-sectional view illustrating formation of channel isolation structures and PMOS vertical channel structures on the NMOS vertical channel structures according to some embodiments of the disclosure. In the illustrated embodiment, material for the channel isolation is first deposited to fill the cylindrical opening 157, and etched back using the capping layer 140 and preliminary isolations structure 177 as a mask to form an annular ring isolation 180 covering the NMOS vertical channel structure 176. In some embodiments, material for the channel isolation is deposited to partially fill the cylindrical opening 157 to reduce or eliminate the need for etching back the channel isolation material. The annular ring isolation 180 has a height to provide insulation between NMOS and PMOS conducting channel regions. P+ channel material is then deposited to fill a remainder of the cylindrical opening 157 and a CMP etch is performed to planarize the structure and provide the vertical channel structure 182 as shown. This completes the CFET stack with FeFET transistors for NMOS and PMOS devices.

FIGS. 3N, 3O and 3P provide cross-sectional views illustrating formation of a back gate structure according to some embodiments of the disclosure. As shown in FIG. 3N, the height of the preliminary core isolation structure 177 is reduced to form a structure 178 and recess 159, and a dielectric spacer 184 is formed within the recess as shown in FIG. 3N. The preliminary dielectric core isolation 177 is then etched to uncover the substrate 10 thereby forming the core isolation structure 179 and opening 161 as shown in FIG. 3O. The opening 161 is then filled with back gate conductor material such as metal to form a core back gate electrode for providing the back gate bias feature as shown in FIG. 3P. 3P is a cross-sectional view illustrating the completed FeCFET stacks having a back gate structure according to one embodiment of the disclosure.

Figure 4:
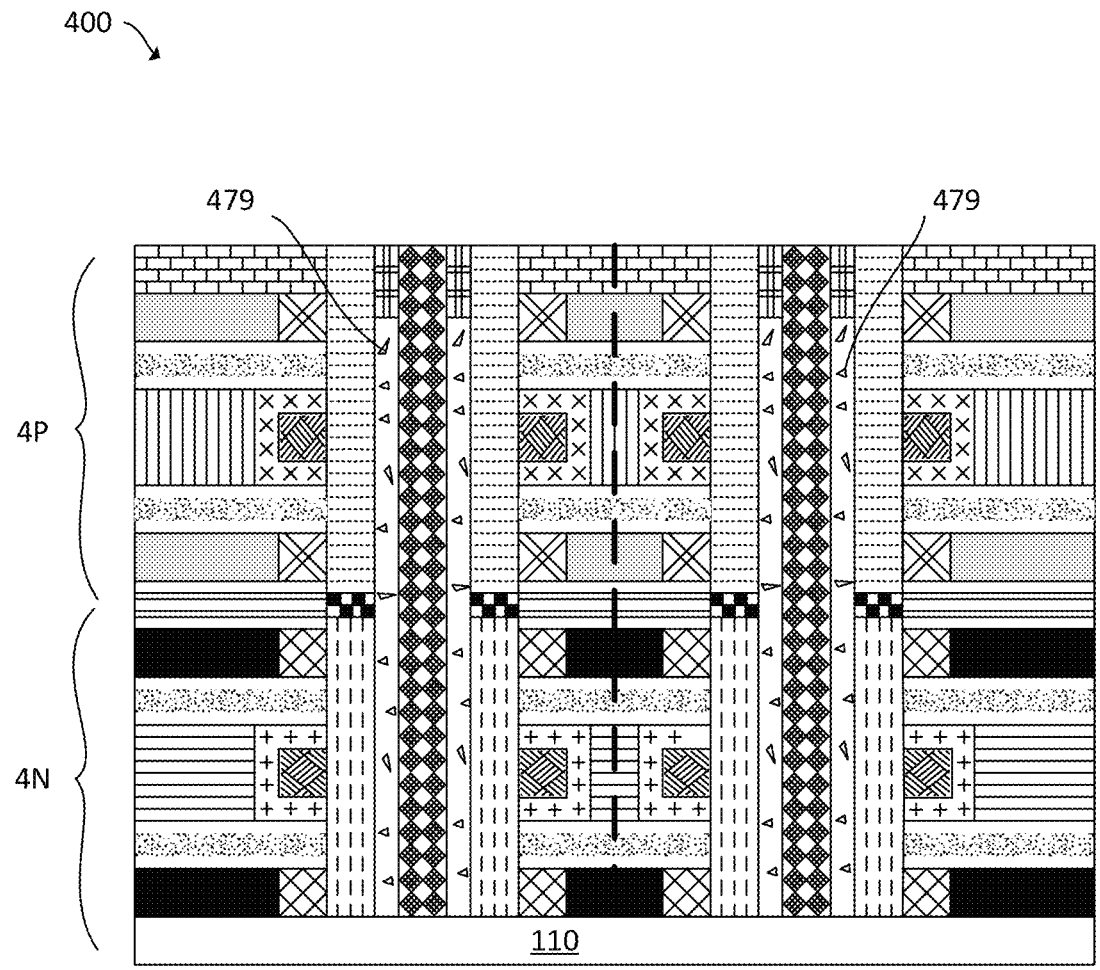
FIG. 4 is a cross-sectional view of an exemplary semiconductor device according to another example embodiment of the disclosure.

FIG. 4 is a cross-sectional view illustrating FeCFET stacks having a back gate structure according to another embodiment of the disclosure. The structure 400 of FIG. 4 is similar to structure 300 in FIG. 3P, except the core isolation material a ferroelectric material which forms a ferroelectric dielectric structure 479 for the back gate. This enables devices to have the Vt set by back bias conditions. The process flow for forming the device 400 with back side ferroelectric material is also similar to that of FIGS. 3A-3P except the core isolation material is replaced with ferroelectric material at step 3K.

Figure 5:
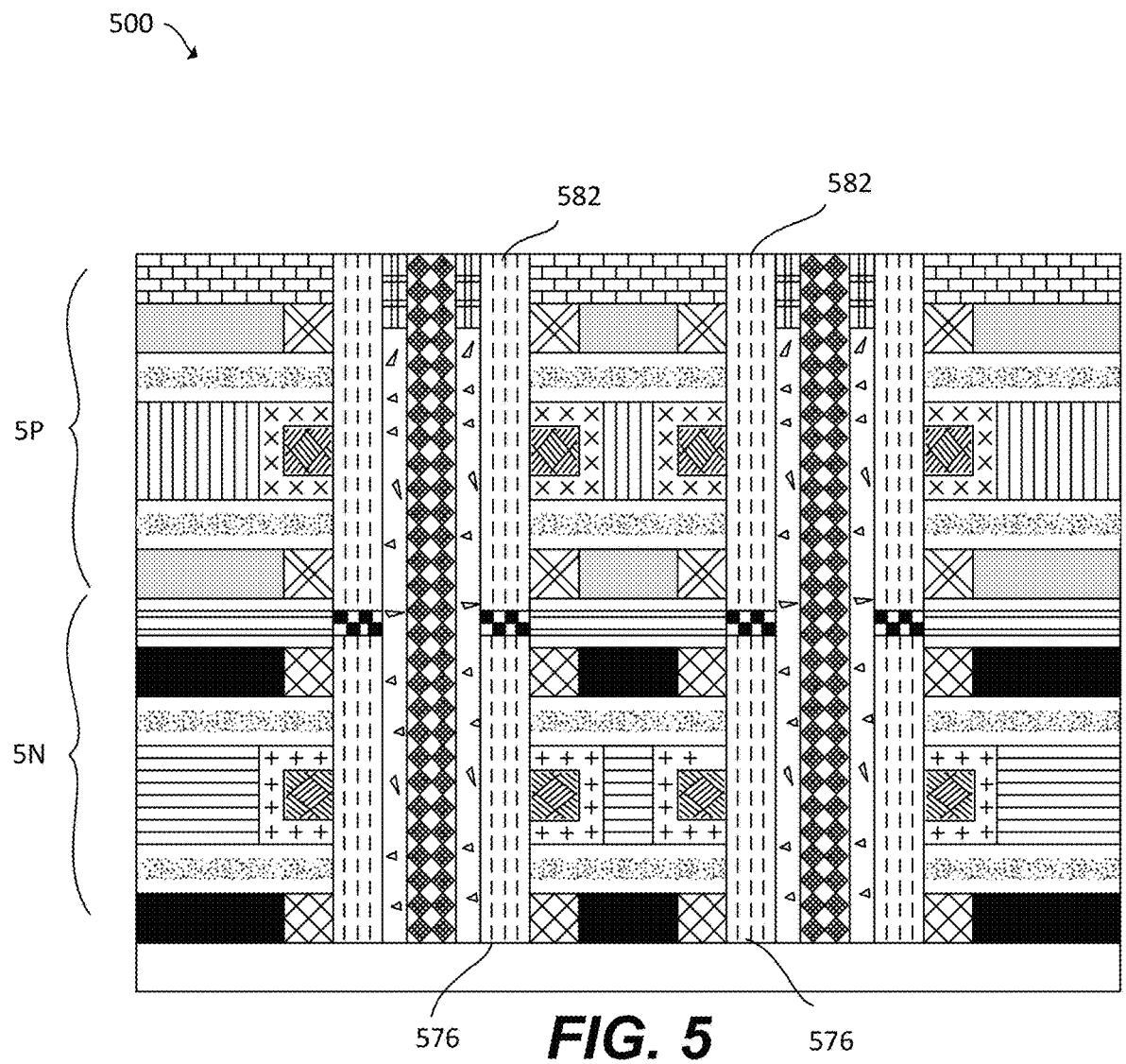
FIG. 5 is a cross-sectional view of an exemplary semiconductor device according to another example embodiment of the disclosure.

FIG. 5 is a cross-sectional view illustrating FeCFET stacks having a back gate structure according to another embodiment of the disclosure. The structure 500 of FIG. 5 is similar to structure 400 in FIG. 4, except the NMOS and PMOS vertical channel structures are formed of the same type semiconductor material as shown by NMOS vertical channel structures 576 and PMOS vertical channel structures 582 in FIG. 5. Thus, the process flow for forming the device 500 with back side ferroelectric material is also similar to that of modified FIGS. 3A-3P for forming the structure 400, except further modified to use the same type of semiconductor material for both NMOS and PMOS.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device comprising:
   a substrate having a substrate surface;
   a transistor stack provided on the substrate surface and comprising a plurality of transistors stacked on each other along a vertical direction that is perpendicular to the substrate surface, wherein each transistor in the transistor stack comprises:
      a vertical channel structure extending along the vertical direction and having a first vertical sidewall and a second vertical sidewall opposite to the first vertical sidewall;
      a ferroelectric gate structure in contact with the first vertical sidewall of the vertical channel structure;
      a back gate structure provided on the substrate and in contact with the second vertical sidewall of the vertical channel structure of each respective transistor in the transistor stack;
      a source region; and
      a drain region, one of the source and drain regions being arranged on an upper side of the ferroelectric gate structure and in contact with the first vertical sidewall, and another of the source and drain regions is arranged on a lower side of the ferroelectric gate structure and in contact with the first vertical sidewall of the vertical channel structure of the transistor in the transistor stack,
      wherein the plurality of transistors in the transistor stack comprise first and second transistors arranged vertically adjacent to each other in the transistor stack to form a complementary field effect transistor (CFET) and wherein:
   for each transistor in the transistor stack:
      the vertical channel structure is a tube-shaped semiconductor structure extending in the vertical direction and having an outer wall as the first vertical sidewall of the vertical channel structure and an inner wall as the second vertical sidewall of the vertical channel structure,
      the ferroelectric gate structure comprises an annular ring of ferroelectric material in contact with the outer wall of the tube-shaped semiconductor structure, and
      the source structure and the drain structure each comprise an annular ring of semiconductor material in contact with the outer wall of the tube-shaped semiconductor structure; and
      the back gate structure comprises:
         a core back gate electrode extending along the vertical direction and passing through an inner region of each of the tube-shaped semiconductor structures, and
         a core back gate dielectric provided in the inner region to insulate the core back gate electrode from each of the tube-shaped semiconductor structures.

2. The semiconductor device of claim 1, wherein the ferroelectric gate structure of each transistor comprises:
   a gate dielectric in contact with the first vertical sidewall of the vertical channel structure of the transistor, the gate dielectric comprising a ferroelectric material; and
   a gate electrode provided in contact with the gate dielectric.

3. The semiconductor device of claim 2, wherein the ferroelectric gate structure of each transistor further comprises a gate electrode interface liner interposed between the gate dielectric and the gate electrode.

4. The semiconductor device of claim 1, wherein the back gate structure comprises:
   a back gate dielectric in contact with the second vertical sidewall of the vertical channel structure of each respective transistor in the transistor stack; and
   a back gate electrode in contact with the back gate dielectric.

5. The semiconductor device of claim 4, wherein the back gate dielectric comprises a ferroelectric material.

6. The semiconductor device of claim 1, wherein each of the source region and drain region comprises a doped semiconductor material.

7. A semiconductor device comprising:
   a substrate having a substrate surface;
   a transistor stack provided on the substrate surface and comprising a plurality of transistors stacked on each other along a vertical direction that is perpendicular to the substrate surface, wherein each transistor in the transistor stack comprises:
      a vertical channel structure extending along the vertical direction and having a first vertical sidewall and a second vertical sidewall opposite to the first vertical sidewall;
      a ferroelectric gate structure in contact with the first vertical sidewall of the vertical channel structure;
      a back gate structure provided on the substrate and in contact with the second vertical sidewall of the vertical channel structure of each respective transistor in the transistor stack;
      a source region; and
      a drain region, one of the source and drain regions being arranged on an upper side of the ferroelectric gate structure and in contact with the first vertical sidewall, and another of the source and drain regions is arranged on a lower side of the ferroelectric gate structure and in contact with the first vertical sidewall of the vertical channel structure of the transistor in the transistor stack,
      wherein the plurality of transistors in the transistor stack comprise first and second transistors arranged vertically adjacent to each other in the transistor stack to form a complementary field effect transistor (CFET).

8. The semiconductor device of claim 7, wherein:
   the first transistor is an NMOS transistor having its source and drain regions made from n-doped Si, and having its ferroelectric gate structure made from $Hf_xZr_{1-x}O$ as the ferroelectric material; and
   the second transistor is a PMOS transistor having its source and drain regions made from p-doped SiGe, and having its ferroelectric gate structure made from $Hf_YZr_{1-Y}O$ as the ferroelectric material, where X and Y of the ferroelectric materials are different from one another.

9. The semiconductor device of claim 8, wherein the core dielectric comprises a ferroelectric material.

10. The semiconductor device of claim 7, wherein the first and second transistors have vertical channel structures made from the same type of semiconductor material.

11. The semiconductor device of claim 7, wherein the first and second transistors have ferroelectric gate structures made from the same type of ferroelectric material.

* * * * *